(12) United States Patent
Milicevic et al.

(10) Patent No.: US 9,051,205 B2
(45) Date of Patent: Jun. 9, 2015

(54) METHOD AND DEVICE FOR MANUFACTURING AN OPTICAL PREFORM

(75) Inventors: Igor Milicevic, Helmond (NL); Mattheus Jacobus Nicolaas van Stralen, Tilburg (NL); Johannes Antoon Hartsuiker, Eindhoven (NL); Roland Gerhardus Jacobus Maria Heuvelmans, Eindhoven (NL)

(73) Assignee: Draka Comteq, B.V., Amsterdam (NL)

( * ) Notice: Subject to any disclaimer, the term of this patent is extended or adjusted under 35 U.S.C. 154(b) by 232 days.

(21) Appl. No.: 12/642,784

(22) Filed: Dec. 19, 2009

(65) Prior Publication Data
US 2010/0154479 A1 Jun. 24, 2010

(30) Foreign Application Priority Data
Dec. 19, 2008 (NL) ...................................... 1036343

(51) Int. Cl.
*C03B 37/018* (2006.01)
*C23C 16/04* (2006.01)
*C23C 16/40* (2006.01)
*C23C 16/455* (2006.01)

(52) U.S. Cl.
CPC ..... *C03B 37/01807* (2013.01); *C03B 37/01823* (2013.01); *C03B 37/0183* (2013.01); *C23C 16/045* (2013.01); *C23C 16/401* (2013.01); *C23C 16/45561* (2013.01)

(58) Field of Classification Search
USPC ............................................ 65/377, 379, 418
IPC .................. C03B 37/01807,37/01823, 37/0183
See application file for complete search history.

(56) References Cited

U.S. PATENT DOCUMENTS

| | | | |
|---|---|---|---|
| 3,589,399 A * | 6/1971 | Vignes .................... | 137/625.3 |
| 4,331,462 A | 5/1982 | Fleming, Jr. et al. | |
| 4,445,918 A | 5/1984 | Modone et al. | |
| 4,474,212 A * | 10/1984 | Schmitz .................. | 137/614.11 |
| 4,738,283 A * | 4/1988 | Shirai et al. .............. | 137/624.11 |
| 4,741,747 A | 5/1988 | Geittner et al. | |
| 4,816,050 A | 3/1989 | Roba | |

(Continued)

FOREIGN PATENT DOCUMENTS

| EP | 0038982 A2 | 11/1981 |
|---|---|---|
| EP | 0333580 A1 | 9/1989 |

(Continued)

OTHER PUBLICATIONS

European Search Report in counterpart European Application No. 09015589 dated Mar. 17, 2010, pp. 1-7.

(Continued)

*Primary Examiner* — John Hoffmann
(74) *Attorney, Agent, or Firm* — Additon, Higgins & Pendleton, P.A.

(57) ABSTRACT

Disclosed is a method and device for manufacturing an optical preform. The method includes supplying dopant-containing glass-forming gases to the interior of a hollow glass substrate tube. Furthermore, the supply flow of dopant-containing glass-forming gases includes a main gas flow and one or more secondary gas flows. The secondary gas flows are divided into subflows, which are supplied to the interior of the hollow glass substrate tube together with the main gas flow. The method further includes effecting deposition of glass layers on the interior surface of the hollow glass substrate tube.

7 Claims, 1 Drawing Sheet

(56) References Cited

U.S. PATENT DOCUMENTS

| | | |
|---|---|---|
| 4,838,643 A | 6/1989 | Hodges et al. |
| 4,857,091 A | 8/1989 | Geittner et al. |
| 4,944,244 A | 7/1990 | Moisan et al. |
| 5,188,648 A | 2/1993 | Geittner et al. |
| 5,504,829 A | 4/1996 | Evans et al. |
| 5,574,816 A | 11/1996 | Yang et al. |
| 5,717,805 A | 2/1998 | Stulpin |
| 5,761,362 A | 6/1998 | Yang et al. |
| 5,911,023 A | 6/1999 | Risch et al. |
| 5,982,968 A | 11/1999 | Stulpin |
| 6,035,087 A | 3/2000 | Bonicel et al. |
| 6,066,397 A | 5/2000 | Risch et al. |
| 6,085,009 A | 7/2000 | Risch et al. |
| 6,134,363 A | 10/2000 | Hinson et al. |
| 6,175,677 B1 | 1/2001 | Yang et al. |
| 6,181,857 B1 | 1/2001 | Emeterio et al. |
| 6,210,802 B1 | 4/2001 | Risch et al. |
| 6,215,931 B1 | 4/2001 | Risch et al. |
| 6,314,224 B1 | 11/2001 | Stevens et al. |
| 6,321,012 B1 | 11/2001 | Shen |
| 6,321,014 B1 | 11/2001 | Overton et al. |
| 6,334,016 B1 | 12/2001 | Greer, IV |
| 6,381,390 B1 | 4/2002 | Hutton et al. |
| 6,405,994 B1 * | 6/2002 | Chen .................. 251/61.1 |
| 6,493,491 B1 | 12/2002 | Shen et al. |
| 6,603,908 B2 | 8/2003 | Dallas et al. |
| 6,618,538 B2 | 9/2003 | Nechitailo et al. |
| 6,658,184 B2 | 12/2003 | Bourget et al. |
| 6,749,446 B2 | 6/2004 | Nechitailo |
| 6,912,347 B2 | 6/2005 | Rossi et al. |
| 6,922,515 B2 | 7/2005 | Nechitailo et al. |
| 6,941,049 B2 | 9/2005 | Risch et al. |
| 7,045,010 B2 | 5/2006 | Sturman, Jr. |
| 7,068,899 B2 | 6/2006 | Milicevic et al. |
| 7,162,128 B2 | 1/2007 | Lovie et al. |
| 7,322,122 B2 | 1/2008 | Overton et al. |
| 7,346,244 B2 | 3/2008 | Gowan et al. |
| 7,356,234 B2 | 4/2008 | de Montmorillon et al. |
| 7,483,613 B2 | 1/2009 | Bigot-Astruc et al. |
| 7,515,795 B2 | 4/2009 | Overton et al. |
| 7,555,186 B2 | 6/2009 | Flammer et al. |
| 7,567,739 B2 | 7/2009 | Overton et al. |
| 7,570,852 B2 | 8/2009 | Nothofer et al. |
| 7,587,111 B2 | 9/2009 | de Montmorillon et al. |
| 7,599,589 B2 | 10/2009 | Overton et al. |
| 7,623,747 B2 | 11/2009 | de Montmorillon et al. |
| 7,639,915 B2 | 12/2009 | Parris et al. |
| 7,646,952 B2 | 1/2010 | Parris |
| 7,646,954 B2 | 1/2010 | Tatat |
| 7,724,998 B2 | 5/2010 | Parris et al. |
| 7,817,891 B2 | 10/2010 | Lavenne et al. |
| 2003/0084685 A1 | 5/2003 | Tumminelli |
| 2005/0041943 A1 | 2/2005 | Milicevic et al. |
| 2008/0292262 A1 | 11/2008 | Overton et al. |
| 2009/0175583 A1 | 7/2009 | Overton |
| 2009/0214167 A1 | 8/2009 | Lookadoo et al. |
| 2009/0252469 A1 | 10/2009 | Sillard et al. |
| 2009/0279833 A1 | 11/2009 | Overton et al. |
| 2009/0279835 A1 | 11/2009 | de Montmorillon et al. |
| 2009/0279836 A1 | 11/2009 | de Montmorillon et al. |
| 2009/0297107 A1 | 12/2009 | Tatat |
| 2010/0021170 A1 | 1/2010 | Lumineau et al. |
| 2010/0028020 A1 | 2/2010 | Gholami et al. |
| 2010/0067855 A1 | 3/2010 | Barker |
| 2010/0067857 A1 | 3/2010 | Lovie et al. |
| 2010/0092135 A1 | 4/2010 | Barker et al. |
| 2010/0092138 A1 | 4/2010 | Overton |
| 2010/0092139 A1 | 4/2010 | Overton |
| 2010/0092140 A1 | 4/2010 | Overton |
| 2010/0118388 A1 | 5/2010 | Pastouret et al. |
| 2010/0119202 A1 | 5/2010 | Overton |
| 2010/0135623 A1 | 6/2010 | Overton |
| 2010/0135624 A1 | 6/2010 | Overton et al. |
| 2010/0135625 A1 | 6/2010 | Overton |
| 2010/0135627 A1 | 6/2010 | Pastouret et al. |
| 2010/0142033 A1 | 6/2010 | Regnier et al. |
| 2010/0142969 A1 | 6/2010 | Gholami et al. |
| 2010/0150505 A1 | 6/2010 | Testu et al. |
| 2010/0154479 A1 | 6/2010 | Milicevic et al. |
| 2011/0044595 A1 | 2/2011 | Sillard et al. |

FOREIGN PATENT DOCUMENTS

| | | |
|---|---|---|
| EP | 1921478 A1 | 5/2008 |
| EP | 2199263 A1 | 6/2010 |
| GB | 2118165 A | 10/1983 |
| JP | 51-081816 A | 7/1976 |
| JP | 58-156550 A | 9/1983 |
| JP | 59-121129 | 7/1984 |
| WO | 2004/101458 A1 | 11/2004 |
| WO | 2009/062131 A1 | 5/2009 |

OTHER PUBLICATIONS

Dutch Search Report in counterpart Dutch Application No. 1036343 dated Dec. 19, 2008, pp. 1-4.

Dutch Written Opinion in counterpart Dutch Application No. 1036343 dated Dec. 19, 2008, pp. 1-7.

Japanese Office Action in counterpart Japanese Application No. 2009-286151 dated Nov. 25, 2013, pp. 1-3.

* cited by examiner

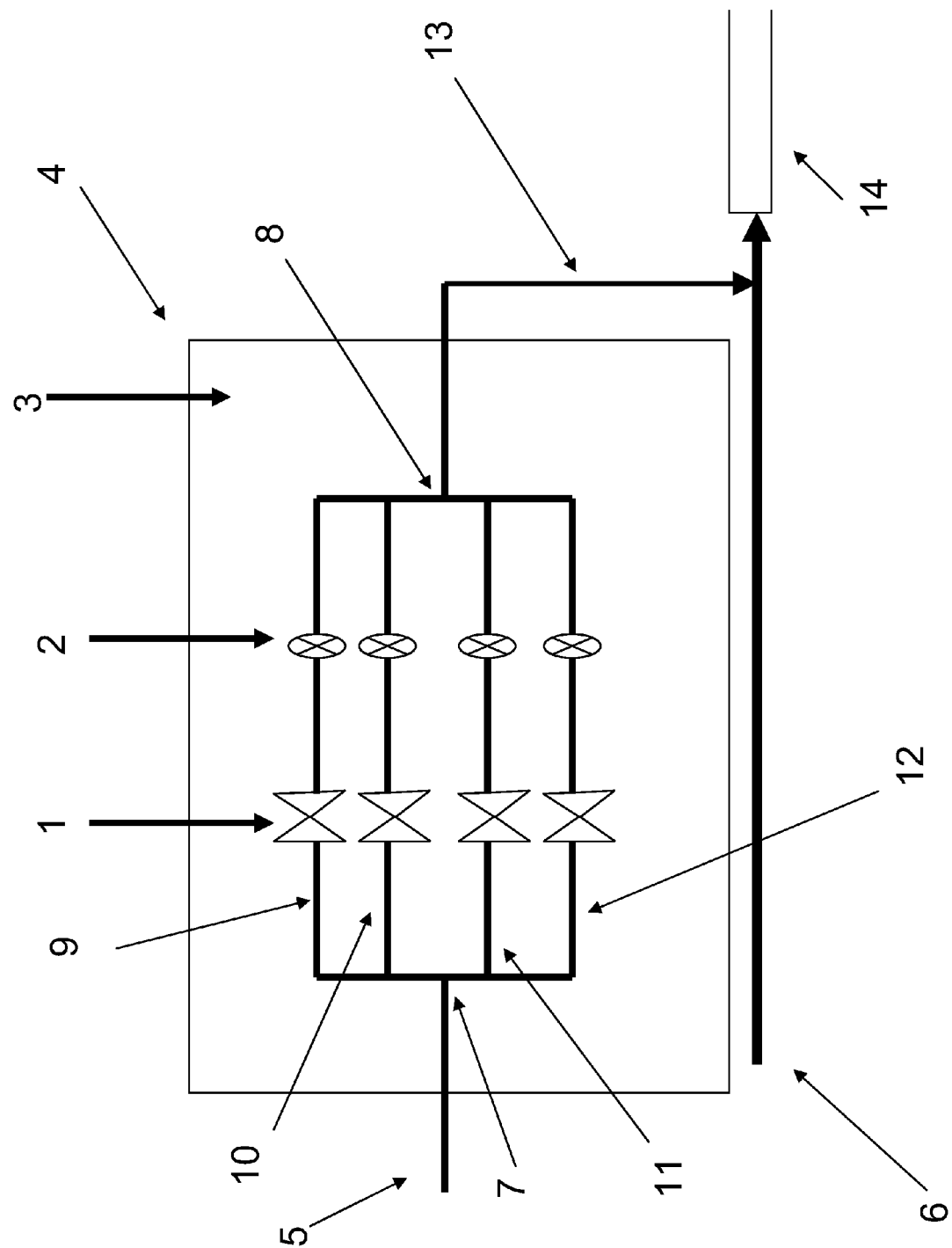

METHOD AND DEVICE FOR MANUFACTURING AN OPTICAL PREFORM

CROSS-REFERENCE TO PRIORITY APPLICATION

This application claims the benefit of pending Dutch Application No. 1036343 for "Method and Device for Manufacturing an Optical Preform" (filed Dec. 19, 2008, at the Dutch Patent Office), which is hereby incorporated by reference in its entirety.

FIELD OF THE INVENTION

The present invention relates to a method for manufacturing a preform for optical fibers via an internal vapor deposition process.

BACKGROUND

Processes and apparatuses for manufacturing fiber-drawing preforms are known from U.S. Pat. No. 4,445,918, U.S. Pat. No. 4,816,050 and U.S. Patent Publication No. 2003/0084685, which are hereby incorporated by reference in their entirety. In addition Japanese Patent No. 59-121129, which is hereby incorporated by reference, relates to a method for manufacturing a glass body for optical fibers in which fine powder layers of glass are formed on the inner walls of glass pipes.

Preforms for optical fibers may be formed using an internal chemical vapor deposition (CVD) technique, wherein doped or undoped glass layers are deposited onto the inner surface of a hollow glass substrate tube. To carry out such a deposition, reactive gases are supplied into one side of the substrate tube (i.e., the supply side) forming a glass layer onto the interior surface of the substrate tube as a result of special process conditions. An energy source is moved back and forth along a specific part of the length of the substrate tube for forming a glass layer. The energy source (e.g., a plasma generator) supplies high-frequency energy, thereby generating a plasma in the interior of the substrate tube. Under such plasma conditions, the reactive glass-forming gases will react (e.g., the plasma CVD technique). It is also possible, however, to supply energy in the form of heat, particularly by using burners, on the outer side of the substrate tube or via a furnace, which surrounds the substrate tube. Typically, the energy source is moved back and forth with respect to the substrate tube.

A drawback of the foregoing techniques is that, because of the reciprocating movement of the energy source, defects near the points of reversal may develop in the layers deposited on the interior surface of the glass substrate tube. The defects are typically called "taper," which may include geometric taper and optic taper. The term "geometric taper" describes the fact that the thickness of the total deposition (i.e., all of the glass layers) is not constant along the length of the tube. The term "optic taper" describes the fact that the optical properties are not constant along the length of the preform, and that consequently the optical properties of the optical fibers obtained from such a preform are not constant. Optic taper is mainly determined by differences in the refractive index, or refractive index profiles, along the length of the preform.

In addition to an adequate control of the geometric taper, with regard to realizing adequate control of the optical properties of the fibers to be formed, it is also desirable that the differences in the longitudinal refractive index profile be as small as possible over a substantial length of the preform. Typically, during deposition processes the length of the deposition zones located at either end of the substrate tube, also referred to as "end tapers," may include about 15 percent of the total length of the substrate tube. The presence of such "taper" leads to an axially non-uniform core cross-section. In particular, the taper forms a region in which the optical and/or geometrical properties of the preform are not uniform. The non-uniformity will result in degradation of the transmission characteristics of the optical fiber. Therefore, the "taper" regions in the preform are generally not used for manufacturing optical fibers. Because such "taper" regions form a significant part of the length of the preform rod, the total fiber length to be obtained from a preform is somewhat limited.

In this regard, taper limits the useful length of the preform, which means that less optical fiber can be obtained from one preform. Additionally, the properties of an optical fiber may not be constant along the length of the fiber due to the occurrence of taper. Constant optical properties of a fiber are important to a fiber producer, however, because the fiber producer will often have to provide a product certificate with certain guarantees. Typically, the product certificate indicates that each individual part of the optical fiber complies with the specification that is issued, particularly if the optical properties are verified (e.g., by the user).

U.S. Pat. No. 4,741,747, which is hereby incorporated by reference, relates to a method for manufacturing optical fibers in which the reduction of so-called end taper is intended to take place by moving the plasma nonlinearly as a function of time in the region of the reversal point and/or by varying the intensity of the plasma along the length of the glass tube.

U.S. Pat. No. 4,857,091, which is hereby incorporated by reference, relates to a method for manufacturing optical fibers. This patent indicates a number of parameters that influence the axial position of the local deposition zone in relation to the plasma generator, including the periodic variation of the microwave power, periodic variation of the pressure in the substrate tube, and periodic variation of the velocity of the resonator being reciprocated over the tube.

European Patent No. 0,038,982 (and its counterpart U.S. Pat. No. 4,331,462), each of which is hereby incorporated by reference, relate to a method for manufacturing optical fibers, in which the plasma generator is moved along the length of the substrate tube. The plasma generator produces a hot zone, such that the hot zone can be regarded as a so-called "tandem hot zone" that includes at least two zones (e.g., zone I and zone II).

European Patent No. 0,333,580 (and its counterpart U.S. Pat. No. 4,944,244), each of which is hereby incorporated by reference, relate to a method for manufacturing preforms for optical fibers in which a variable power microwave generator is used, but in which no use is made of a non-isothermal plasma being moved back and forth between two points of reversal along the length of the substrate tube. U.S. Pat. No. 4,944,244, discloses a method for manufacturing optical preforms in which the power of the energy source is continuously controlled during the deposition process based upon a signal, which is a function inter alia of deposition of vitreous layers on the interior surface of the substrate tube.

British Patent No. 2,118,165, which is hereby incorporated by reference, relates to a method for manufacturing a preform for an optical fiber in which the velocity of a heat source being moved axially along the length of the substrate tube is in accordance with a specific mathematical equation. The velocity is a function of the position of the heat source along the substrate tube, such that the total deposition thickness of the glass layers is substantially constant along the length of the tube.

U.S. Pat. No. 5,188,648, which is hereby incorporated by reference, relates to a method for manufacturing an optical preform in which the movement of the plasma is interrupted each time the plasma reaches the point of reversal near the gas inlet point of the substrate tube, while the glass deposition continues. The interruption of the plasma movement lasts at least 0.1 second. This patent particularly relates to a reduction of the geometric taper of the preform core.

U.S. Pat. No. 7,068,899 (and its counterpart International Application No. 2004/101458), each of which is hereby incorporated by reference, relate to a deposition method in which the plasma is moved along the length of a hollow substrate tube and is changed in a first end region adjacent to a point of reversal, both as a function of time in the deposition process and as a function of the position in the first end region. The end point of the first end region coincides with the point of reversal, and the starting point is located further away from the point of reversal than the deceleration point. The first end region has a length that is designed to reduce taper in the preform.

Notwithstanding the foregoing, methods for manufacturing preforms designed to improve geometric taper have typically led to increases in optic taper, and vice versa.

SUMMARY

Accordingly, in one aspect, the present invention relates to a method for manufacturing a preform for optical fibers via an internal vapor deposition process. Typically, the method includes supplying dopant-containing glass-forming gases to the interior of a hollow glass substrate tube. Typically, the supply flow includes a main gas flow and one or more secondary gas flows. One or more secondary gas flows may include two or more subflows. In some exemplary embodiments, the main gas flow includes mostly glass-forming gases, and the secondary gas flows primarily include one or more dopants. The method may further include creating conditions in the interior of the hollow glass substrate tube to cause deposition of glass layers onto the interior surface of the hollow glass substrate tube. The method may further include collapsing the substrate tube to form a solid preform.

In another aspect, the present invention relates to a device or apparatus for supplying gases to the interior of a hollow glass substrate tube to obtain an optical preform, which may be drawn to form an optical fiber. Typically, a supply flow passes through the device. In exemplary embodiments, the supply flow includes a main gas flow of primarily glass-forming gases and one or more secondary gas flows of primarily dopant gases (e.g., the secondary gas flows include carrier gases with the dopants).

In yet another aspect, the present invention provides a method and associated apparatus for manufacturing a preform that exhibits a small amount of geometric and optic taper.

In yet another aspect, the present invention provides a method and associated apparatus for manufacturing a preform that has substantially constant optical properties not only at both its ends but also over a substantial length of the preform (i.e., in the region between the its two ends).

The foregoing illustrative summary, as well as other exemplary objectives and/or advantages of the invention, and the manner in which the same are accomplished, are further explained within the following detailed description and its accompanying drawings.

BRIEF DESCRIPTION OF THE DRAWING

FIG. 1 schematically depicts an exemplary device according to the present invention.

DETAILED DESCRIPTION

The present invention embraces methods for manufacturing an optical-fiber preform via an internal vapor deposition process. An exemplary method includes subdividing the secondary gas flow into N subflows, which are supplied to the interior of the hollow substrate tube together with the main gas flow. Typically, the number of subflows (i.e., N) is greater than or equal to two (i.e., N≥2).

The taper present in a solid optical preform typically depends inter alia on the deposition rate of the glass layers on the interior surface of the hollow substrate tube. Typically, increasing the deposition rate generally leads to a deterioration of the uniformity of the deposited glass layers. Subdividing the secondary gas flow into one or more subflows, precisely adjusting the flow rate of each subflow, and combining the subflows with one another and subsequently with the main gas flow results in an optical preform having a small amount of geometric and optic taper and substantially constant optical properties along the length of the preform. In this regard, exemplary embodiments of the present method and associated apparatus include controlling the refractive index in the longitudinal direction in the preform.

The flow rate of a medium, such as an ideal gas, through an orifice is determined on the basis of the following equation:

$$m = \rho V A \text{ (kg/s)},$$

wherein:
m=mass flow of an ideal gas (kg/s),
$\rho$=gas density (kg/m$^3$),
V=gas velocity (m/s), and
A=orifice area (m$^2$).

The gas flow rate through an orifice may be approximated by the following equation:

$$m = c(p_1 - p_2) A_1$$

where:
c=constant (dependent on the gas used),
$p_1$=static pressure in front of the orifice (Pa),
$p_2$=static pressure after the orifice (Pa), and
$A_1$=orifice area (m$^2$).

On the basis of the preceding equations, it is possible to determine (without accounting for gravitation) the mass flow rate of the gas as a function of the pressure drop through an orifice having a radius r using the following equation:

$$m = c \Delta p r^2 \pi.$$

In this regard, a number of orifices may be used in a parallel arrangement and the interior radius of the orifice may be selected so that the maximum flow through each orifice varies, for example, by a ratio of 1:2:4:8, etc. Accordingly, total flow of the secondary gas flow can be adjusted in discrete steps, and the magnitude of the gas flow of the dopant(s) can be precisely set.

In some embodiments, at least four subflows (i.e., N≥4) may be used to precisely control the magnitude of the secondary gas flow. Setting the respective flow rates for each subflow sets the flow rate for the secondary gas flow.

In one exemplary embodiment, the maximum flow of a subflow is at least twice as large (i.e., 2×) as the maximum flow of the other subflows. By way of illustration, utilizing four subflows (N=4), the maximum flow of the first subflow is set at 1 (arbitrary unit, AU), the maximum flow of the second subflow is set at 2 (AU), the maximum flow of the third subflow is set at 4 (AU), and the maximum flow of the fourth subflow is set at 8 (AU). In this regard, it is thus possible to use 16 settings between a minimum flow rate (no flow) and a maximum flow rate (i.e., the controllable valve in each subflow is open). Consequently, a relationship exists between the N subflows, as follows. The maximum flow of subflow $N_i$ is twice as large as the maximum flow of subflow ($N_{i-1}$), and the maximum flow of subflow $N_i$ is half (i.e., twice as small as) the maximum flow of subflow ($N_{i+1}$).

In another exemplary embodiment having two subflows (i.e., N=2), the maximum flow of subflow $N_2$ is preferably twice as large as the maximum flow of subflow $N_1$. Typically, when three or more subflows are utilized (i.e., N≥3) the maximum flow of subflow $N_i$ is twice as large as the maximum flow of subflow $N_{i-1}$, and the maximum flow of subflow $N_i$ is half the maximum flow of subflow $N_{i+1}$. For example, subflows $N_1$, $N_2$, and $N_3$ will have maximum flows of 1 (AU), 2 (AU), and 4 (AU) respectively.

The foregoing exemplary embodiment employs a geometric progression having a common ratio of two. That said, with respect to the respective maximum flows of the subflows, it is within the scope of the present invention to employ alternative progressions (e.g., a geometric progression having a common ratio other than two) or perhaps combinations of different progressions. Subflows defining increasing maximum flow rates may facilitate less piping.

That said, it is within the scope of the present invention for a number of subflows to have the same maximum flow. For example, in an embodiment having 10 subflows, the maximum flow of subflows $N_1$, $N_2$, $N_3$ ... $N_9$ may be the same, and the maximum flow of subflow $N_{10}$ will typically be about twice as large as the maximum flow of the other subflows.

Typically, to set the flow rate of the subflow precisely, the secondary gas flows are placed in a temperature-controlled environment. In this regard, the undesirable effects of temperature expansion and pressure fluctuations may be reduced.

In an exemplary embodiment, a controllable valve and an orifice are positioned in the flow path of each subflow. In this regard, the controllable valve blocks or passes its respective subflow and the orifice controls the magnitude of its respective subflow. The controllable valve can be set in two positions (e.g., a binary valve having an open position and a closed position). The amount of dopant(s) to be supplied to the interior of the substrate tube is adjusted by controlling the valves in each individual subflow (e.g., setting a mass flow rate for each of the dopant-containing subflows). Therefore, the flow may be set in discrete steps between a minimum flow rate for the secondary gas flow (e.g., all valves closed) and a maximum flow (e.g., all valves open).

In some exemplary embodiments, the magnitude of the secondary gas flow may be set precisely and quickly by using a control frequency of at least 20 Hz for setting the controllable valve. In another exemplary embodiment, the control frequency is at least 50 Hz. Typically, the controllable valve(s) are controlled by an electronic arithmetic unit.

In an exemplary embodiment of a method of internal vapor deposition, the flow rate of dopants in the main gas flow is set at a level that is about 10 percent lower than the flow rate that would be used for attaining the desired refractive index value (by using such dopants).

In another exemplary embodiment of the present invention, an optical preform is produced in a first step using a PCVD process, wherein the glass-forming gases containing dopants are supplied to the interior of the hollow glass substrate tube primarily via the main gas flow. In other words, in a first step, a preform is formed, for example, as disclosed in commonly assigned U.S. Pat. No. 7,068,899. After completion of the deposition process, followed by a usual collapse treatment, the longitudinal refractive index profile of the resulting solid preform is determined. The measured refractive index profile is compared with the desired refractive index profile. In this regard, the difference between the measured refractive index profile and the desired refractive index profile at any position of the solid preform may be determined (i.e., calculated). Based on the refractive-index difference (and the measured longitudinal refractive index profile), a new deposition process is started using a main gas flow and one or more secondary gas flows. The amount of dopant (e.g., germanium, such as in the form of germanium tetrachloride, $GeCl_4$) in the main gas flow (e.g., including $SiO_2$ and silicon tetrachloride, $SiCl_4$) may be adapted to increase (or decrease) the refractive index level to a determined level along the entire length of the preform. Typically, the flow rate of the main gas flow will be set at a substantially constant value during the deposition process. The amount of extra dopant supplied via the secondary gas flow is based on the determined difference in the longitudinal refractive index profile. The flow rate of the secondary gas flows may be precisely set as a function of the longitudinal position in the hollow substrate tube. In this regard, the main gas flow provides a "basic setting" of the refractive index, and the one or more secondary gas flows provide the desired "end level." Typically, the end level is substantially constant over a substantial (e.g., maximum) length of the preform.

The control, therefore, typically takes place by comparing a previously determined refractive index profile with a desired refractive index profile. The difference between the two refractive index profiles is typically used as a basis for setting the flow rate of the main gas flow and/or at least one of the secondary gas flows, so that control of the controllable valve(s) occurs as a function of time.

In an exemplary embodiment in which a correction with germanium takes place, the main gas flow typically contains an amount of germanium such that the resulting refractive index value is equal to or less than the desired refractive index value in the desired longitudinal refractive index profile. The amount of extra germanium, which is supplied via one or more secondary gas flows, can then be determined as a function of longitudinal position of the reaction zone during the deposition process. Accordingly, the flow rate of the one or more secondary gas flows, and thus the amount of dopant(s) (refractive index increasing and/or decreasing) to be supplied, can be varied as a function of time during the deposition process. Because the reaction zone reciprocates over the substrate tube during the deposition process, it is possible to set the amount of dopants precisely at any desired moment (i.e., any desired position on the substrate tube) during the deposition process.

In an exemplary embodiment in which the longitudinal refractive index value is corrected by using a refractive index decreasing dopant, particularly fluorine. It is desirable to add fluorine to the main gas flow, albeit in an amount such that the resulting refractive index value will be equal to or greater than the desired refractive index value in the intended longitudinal refractive index profile. Subsequently, the amount of additional fluorine, which is supplied via one or more secondary gas flows, can be determined as a function of the longitudinal position of the reaction zone during the deposition process in the substrate tube.

Exemplary embodiments of the method of the present invention have been used to manufacture an optical preform with few deviations in the refractive index. In this regard, exemplary embodiments of the present invention may be used to produce a substantially uniform refractive index profile. Both refractive index increasing and refractive index decreasing dopants (e.g., $GeCl_4$ and $C_2F_6$) may be used in the secondary gas flows. The dopants are typically incorporated into the glass. In an exemplary embodiment, one or more dopants are present in the main glass flow.

In some embodiments, at least two secondary gas flows are used. One secondary gas flow supplies the refractive index decreasing dopants, and the other secondary gas flow supplies the refractive index increasing dopants. Accordingly, a precise metering of dopants may be employed to reduce any deviations in the refractive index in the longitudinal direction (e.g., optical taper). Typically, the secondary gas flow for each dopant is divided into a number of subflows. Although, different dopants may be combined in one single secondary gas flow, doing so inhibits the ability to individually control each dopant.

In an exemplary embodiment, only the secondary gas flow contains dopant(s). Such an embodiment may be especially useful when low concentrations of dopant(s) are desired.

The present invention may be used, for example, in the field of plasma chemical vapor deposition (PCVD). Typically, an internal deposition process is carried out using a plasma in a hollow, quartz substrate tube. In such a process, a microwave generator, in particular a resonator, is reciprocated along the length of the substrate tube, between two reversal points. The plasma zone moves along the length of the substrate tube, and the deposition of the glass-forming precursors takes place in the plasma zone. Accordingly, it is possible to control the gas composition in the substrate tube as a function of the resonator position. In other words, the dopant concentration within a resonator stroke may be varied according to the position. The resonator velocities are typically in the range of 10-40 meters/min. In this regard, it is possible to have deposition of a particular glass take place at a predetermined position within the interior of the hollow substrate tube. The use of a main gas flow and one or more secondary gas flows makes it possible to produce any desired refractive index value at any desired position in the hollow substrate tube.

The present invention further relates to a device for supplying gases to the interior of a hollow substrate tube (e.g., via a system of gas lines). In some exemplary embodiments, the supply flow of the device includes a main gas flow and one or more secondary gas flows. Typically, the main gas flow primarily includes glass-forming gases and the secondary gas flow(s) primarily includes dopant(s). In exemplary embodiments, the secondary gas flow includes a first distribution unit for dividing the secondary gas flows into N subflows and a second distribution unit for re-combining all N subflows.

As will be appreciated by those having ordinary skill in the art, the respective main gas flow and secondary gas flows (including subflows) may be effected using pipe systems or other appropriate piping for transporting gases (e.g., gas lines and sub-lines).

In an exemplary embodiment, a controllable valve and an orifice are positioned in the flow path of each subflow. The controllable valve blocks or passes its respective subflow, and the orifice controls the magnitude of its respective subflow.

In another exemplary embodiment, the first distribution unit and the second distribution unit are positioned in a temperature-controlled environment.

In yet another exemplary embodiment, the device includes a system for setting the magnitude of the main gas flow and the one or more secondary gas flows to achieve a uniform longitudinal refractive index profile of the optical preform.

The present invention further relates to an exemplary method used in a plasma chemical vapor deposition (PCVD) process. The exemplary method includes varying the composition of the doped glass-forming gases supplied to the interior of a hollow glass substrate tube as a function of the position of the plasma zone during the deposition of glass layers. In this regard, the exemplary method may be used to control the refractive index in the longitudinal direction of an optical preform.

The supply line for the secondary gas flow is substantially leakage proof to provide a reliable setting. Accordingly, the connection of the gas line system is subjected to a leakage test before the production of an optical preform is initiated. Typically, this test is conducted by filling the system with a gas under a high pressure, sealing the entire gas system, and registering the decrease in pressure as a function of time.

The present application will be explained in more detail by the following non-limiting, illustrative example.

EXAMPLE

FIG. 1 schematically depicts a gas supply system 4 according to an exemplary embodiment. The gas supply system 4 includes a main gas flow 6 and a secondary gas flow 5. The main gas flow 6 primarily includes $SiCl_4/O_2$, and the secondary gas flow 5 includes a germanium-containing compound (e.g., $GeCl_4$). Typically, the secondary gas flow 5 includes a carrier gas (e.g., oxygen) in which the dopant is present. The main gas flow 6 may include refractive index increasing and/or decreasing dopants (e.g., $GeCl_4$ and/or $C_2F_6$).

The inlet secondary gas flow 5 is subdivided into four subflows 9, 10, 11, 12, using a first distribution unit 7. A controllable valve 1 and an orifice 2 are present in the flow path of each subflow 9-12. The maximum flow value of the subflow 9 is 1 (arbitrary unit). The maximum flow values of subflows 10, 11 and 12 are 2 (AU), 4 (AU), and 8 (AU), respectively. The subflows 9-12 are combined into an outlet secondary gas flow 13 via a second distribution unit 8. The outlet secondary gas flow 13 is combined with the main gas flow 6 and supplied to a hollow glass substrate tube 14.

An internal deposition process takes place in the interior of the substrate tube 14. The substrate tube 14 is placed in a furnace (not shown), in which a resonator (not shown) is present. Microwaves are supplied to the resonator, and the resonator is reciprocated over a specific length of the substrate tube 14 to create conditions in the interior of the substrate tube 14 such that one or more glass layers will be deposited on the interior surface of the substrate tube 14.

In this regard, a suitable deposition process is disclosed in the aforementioned, commonly assigned U.S. Pat. No. 7,068,899. After the deposition and collapsing processes, the solid preform is provided. If desired, additional glass on the outer side of the substrate tube may be provided, for example, via sleeving. Thereafter, the eventual drawing process may be effected to yield optical fiber.

To execute a proper deposition process, the intended refractive index profile is known in advance, while the amount of dopant(s) to be supplied to the interior of the substrate tube 14 is controlled by controlling the valves 1 in each individual subflow 9-12. In this regard, it is possible, in the illustrated exemplary embodiment, to set 16 steps between a minimum flow rate for the secondary gas flow (e.g., no flow when all the valves 1 are closed) and a maximum flow rate (e.g., when all the valves 1 in the subflows 9-12 are open). The magnitude of the secondary gas flow's mass flow rate can be controlled by setting the respective mass flow rates for each of its constituent subflows 9-12. The valves 1 are controlled via an electronically controlled measuring and control system (e.g., software and hardware, not shown). To reduce temperature fluctuations, the gas supply system 4 is connected to a temperature control system 3. Although four subflows 9-12 are shown in FIG. 1, it is also possible to use different numbers of subflows (e.g., two, eight, sixteen, etc.).

Additionally, it is possible to use a second gas supply unit (not shown), in which precise metering of other dopant(s) (e.g., also including one or more carrier gases) takes place. The second gas supply unit (not shown), which is typically connected to a temperature control system, also includes a number of subflows, which are each provided with a controllable valve and an orifice.

Using the foregoing method and associated apparatus for manufacturing an optical preform, it is possible to achieve a substantially uniform refractive index profile having few deviations from the intended refractive index profile along the length of a glass substrate tube.

To supplement the present disclosure, this application incorporates entirely by reference the following commonly assigned patents, patent application publications, and patent applications: U.S. Pat. No. 4,838,643 for a Single Mode Bend Insensitive Fiber for Use in Fiber Optic Guidance Applications (Hodges et al.); U.S. Pat. No. 7,623,747 for a Single Mode Optical Fiber (de Montmorillon et al.); U.S. Pat. No. 7,587,111 for a Single-Mode Optical Fiber (de Montmorillon et al.); U.S. Pat. No. 7,356,234 for a Chromatic Dispersion Compensating Fiber (de Montmorillon et al.); U.S. Pat. No. 7,483,613 for a Chromatic Dispersion Compensating Fiber (de Montmorillon et al.); U.S. Pat. No. 7,555,186 for an Optical Fiber (Flammer et al.); U.S. Patent Application Publication No. US2009/0252469 A1 for a Dispersion-Shifted Optical Fiber (Sillard et al.); U.S. patent application Ser. No. 12/098,804 for a Transmission Optical Fiber Having Large Effective Area (Sillard et al.), filed Apr. 7, 2008; International Patent Application Publication No. WO 2009/062131 A1 for a Microbend-Resistant Optical Fiber, (Overton); U.S. Patent Application Publication No. US2009/0175583 A1 for a Microbend-Resistant Optical Fiber, (Overton); U.S. Patent Application Publication No. US2009/0279835 A1 for a Single-Mode Optical Fiber Having Reduced Bending Losses, filed May 6, 2009, (de Montmorillon et al.); U.S. Patent Application Publication No. US2009/0279836 A1 for a Bend-Insensitive Single-Mode Optical Fiber, filed May 6, 2009, (de Montmorillon et al.); U.S. patent application Ser. No. 12/489,995 for a Wavelength Multiplexed Optical System with Multimode Optical Fibers, filed Jun. 23, 2009, (Lumineau et al.); U.S. patent application Ser. No. 12/498,439 for a Multimode Optical Fibers, filed Jul. 7, 2009, (Gholami et al.); U.S. patent application Ser. No. 12/614,011 for a Reduced-Diameter Optical Fiber, filed Nov. 6, 2009, (Overton); U.S. patent application Ser. No. 12/614,172 for a Multimode Optical System, filed Nov. 6, 2009, (Gholami et al.); U.S. patent application Ser. No. 12/617,316 for an Amplifying Optical Fiber and Method of Manufacturing, filed Nov. 12, 2009, (Pastouret et al.) U.S. patent application Ser. No. 12/629,495 for an Amplifying Optical Fiber and Production Method, filed Dec. 2, 2009, (Pastouret et al.); U.S. patent application Ser. No. 12/633,229 for an Ionizing Radiation-Resistant Optical Fiber Amplifier, filed Dec. 8, 2009, (Regnier et al.); and U.S. patent application Ser. No. 12/636,277 for a Buffered Optical Fiber, filed Dec. 11, 2009, (Testu et al.).

To supplement the present disclosure, this application further incorporates entirely by reference the following commonly assigned patents, patent application publications, and patent applications: U.S. Pat. No. 5,574,816 for Polypropylene-Polyethylene Copolymer Buffer Tubes for Optical Fiber Cables and Method for Making the Same; U.S. Pat. No. 5,717,805 for Stress Concentrations in an Optical Fiber Ribbon to Facilitate Separation of Ribbon Matrix Material; U.S. Pat. No. 5,761,362 for Polypropylene-Polyethylene Copolymer Buffer Tubes for Optical Fiber Cables and Method for Making the Same; U.S. Pat. No. 5,911,023 for Polyolefin Materials Suitable for Optical Fiber Cable Components; U.S. Pat. No. 5,982,968 for Stress Concentrations in an Optical Fiber Ribbon to Facilitate Separation of Ribbon Matrix Material; U.S. Pat. No. 6,035,087 for an Optical Unit for Fiber Optic Cables; U.S. Pat. No. 6,066,397 for Polypropylene Filler Rods for Optical Fiber Communications Cables; U.S. Pat. No. 6,175,677 for an Optical Fiber Multi-Ribbon and Method for Making the Same; U.S. Pat. No. 6,085,009 for Water Blocking Gels Compatible with Polyolefin Optical Fiber Cable Buffer Tubes and Cables Made Therewith; U.S. Pat. No. 6,215,931 for Flexible Thermoplastic Polyolefin Elastomers for Buffering Transmission Elements in a Telecommunications Cable; U.S. Pat. No. 6,134,363 for a Method for Accessing Optical Fibers in the Midspan Region of an Optical Fiber Cable; U.S. Pat. No. 6,381,390 for a Color-Coded Optical Fiber Ribbon and Die for Making the Same; U.S. Pat. No. 6,181,857 for a Method for Accessing Optical Fibers Contained in a Sheath; U.S. Pat. No. 6,314,224 for a Thick-Walled Cable Jacket with Non-Circular Cavity Cross Section; U.S. Pat. No. 6,334,016 for an Optical Fiber Ribbon Matrix Material Having Optimal Handling Characteristics; U.S. Pat. No. 6,321,012 for an Optical Fiber Having Water Swellable Material for Identifying Grouping of Fiber Groups; U.S. Pat. No. 6,321,014 for a Method for Manufacturing Optical Fiber Ribbon; U.S. Pat. No. 6,210,802 for Polypropylene Filler Rods for Optical Fiber Communications Cables; U.S. Pat. No. 6,493,491 for an Optical Drop Cable for Aerial Installation; U.S. Pat. No. 7,346,244 for a Coated Central Strength Member for Fiber Optic Cables with Reduced Shrinkage; U.S. Pat. No. 6,658,184 for a Protective Skin for Optical Fibers; U.S. Pat. No. 6,603,908 for a Buffer Tube that Results in Easy Access to and Low Attenuation of Fibers Disposed Within Buffer Tube; U.S. Pat. No. 7,045,010 for an Applicator for High-Speed Gel Buffering of Flextube Optical Fiber Bundles; U.S. Pat. No. 6,749,446 for an Optical Fiber Cable with Cushion Members Protecting Optical Fiber Ribbon Stack; U.S. Pat. No. 6,922,515 for a Method and Apparatus to Reduce Variation of Excess Fiber Length in Buffer Tubes of Fiber Optic Cables; U.S. Pat. No. 6,618,538 for a Method and Apparatus to Reduce Variation of Excess Fiber Length in Buffer Tubes of Fiber Optic Cables; U.S. Pat. No. 7,322,122 for a Method and Apparatus for Curing a Fiber Having at Least Two Fiber Coating Curing Stages; U.S. Pat. No. 6,912,347 for an Optimized Fiber Optic Cable Suitable for Microduct Blown Installation; U.S. Pat. No. 6,941,049 for a Fiber Optic Cable Having No Rigid Strength Members and a Reduced Coefficient of Thermal Expansion; U.S. Pat. No. 7,162,128 for Use of Buffer Tube Coupling Coil to Prevent Fiber Retraction; U.S. Pat. No. 7,515,795 for a Water-Swellable Tape, Adhesive-Backed for Coupling When Used Inside a Buffer Tube (Overton et al.); U.S. Patent Application Publication No. 2008/0292262 for a Grease-Free Buffer Optical Fiber Buffer Tube Construction Utilizing a Water-Swellable, Texturized Yarn (Overton et al.); European Patent Application Publication No. 1,921,478 A1, for a Telecommunication Optical Fiber Cable (Tatat et al.); U.S. Pat. No. 7,570,852 for an Optical Fiber Cable Suited for Blown Installation or Pushing Installation in Microducts of Small Diameter (Nothofer et al.); U.S. Patent Application Publication No. US2008/0037942 A1 for an Optical Fiber Telecommunications Cable (Tatat); U.S. Pat. No. 7,599,589 for a Gel-Free Buffer Tube with Adhesively Coupled Optical Element (Overton et al.); U.S. Pat. No. 7,567,739 for a Fiber Optic Cable Having a Water-Swellable Element (Overton); U.S. Patent Application Publication No. US2009/0041414 A1 for a Method for Accessing Optical Fibers within a Telecommunication Cable (Lavenne et al.); U.S. Patent Application Publication No. US2009/0003781 A1 for an Optical Fiber Cable Having a Deformable Coupling Element (Parris et al.); U.S. Patent Application Publication No. US2009/0003779 A1 for an Optical Fiber Cable Having Raised Coupling Supports (Parris); U.S. Patent Application Publication No. US2009/0003785 A1 for a Coupling Composition for Optical Fiber Cables (Parris et al.); U.S. Patent Application Publication No. US2009/0214167 A1 for a Buffer Tube with Hollow Channels, (Lookadoo et al.); U.S. patent application Ser. No. 12/466,965 for an Optical Fiber Telecommunication Cable, filed May 15, 2009, (Tatat); U.S. patent application Ser. No. 12/506,533 for a Buffer Tube with Adhesively Coupled Optical Fibers and/or Water-Swellable Element, filed Jul. 21, 2009, (Overton et al.); U.S. patent application Ser. No. 12/557,055 for an Optical Fiber Cable Assembly, filed Sep. 10, 2009, (Barker et al.); U.S. patent application Ser. No. 12/557,086 for a High-Fiber-Density Optical Fiber Cable, filed Sep. 10, 2009, (Louie et al.); U.S. patent application Ser. No. 12/558,390 for a Buffer Tubes for Mid-Span Storage, filed Sep. 11, 2009, (Barker); U.S. patent application Ser. No. 12/614,692 for Single-Fiber Drop Cables for MDU Deployments, filed Nov. 9, 2009, (Overton); U.S. patent application Ser. No. 12/614,754 for Optical-Fiber Loose Tube Cables, filed Nov. 9, 2009, (Overton); U.S. patent application Ser. No. 12/615,003 for a Reduced-Size Flat Drop Cable, filed Nov. 9, 2009, (Overton et al.); U.S. patent application Ser. No. 12/615,106 for ADSS Cables with High-Performance Optical Fiber, filed Nov. 9, 2009, (Overton); U.S. patent application Ser. No. 12/615,698 for Reduced-Diameter Ribbon Cables with High-Performance Optical Fiber, filed Nov. 10, 2009, (Overton); and U.S. patent application Ser. No. 12/615,737 for a Reduced-Diameter, Easy-Access Loose Tube Cable, filed Nov. 10, 2009, (Overton).

In the specification and/or figures, typical embodiments of the invention have been disclosed. The present invention is not limited to such exemplary embodiments. The figures are schematic representations and so are not necessarily drawn to scale. Unless otherwise noted, specific terms have been used in a generic and descriptive sense and not for purposes of limitation.

The invention claimed is:

1. A method for manufacturing an optical-fiber preform, comprising:
   subdividing a secondary gas flow that includes one or more dopants into a plurality of parallel dopant-containing subflows;
   setting a mass flow rate for each of the dopant-containing subflows;
   supplying the dopant-containing subflows and a main gas flow that includes glass-forming gases to the interior of a hollow substrate tube having an inlet side, an outlet side, and an interior surface; and
   creating conditions within the interior of the substrate tube to deposit glass layers onto the substrate tube's interior surface.

2. A method according to claim 1, comprising, after the step of creating conditions within the interior of the substrate tube to deposit glass layers onto the substrate tube's interior surface, collapsing the substrate tube to form a solid preform.

3. A method according to claim 1, wherein the step of subdividing the secondary gas flow comprises subdividing the secondary gas flow into at least four dopant-containing subflows.

4. A method according to claim 1, wherein the secondary gas flow is in a temperature-controlled environment.

5. A method according to claim 1, wherein the main gas flow contains one or more dopants.

6. A method for manufacturing an optical-fiber preform, comprising:
   subdividing a secondary gas flow into N parallel subflows, the secondary gas flow including one or more dopants;
   setting a mass flow rate for each of the N subflows;
   supplying the N subflows to the interior of a substrate tube having an inlet side, an outlet side, and an interior surface; and
   supplying a main gas flow to the interior of the substrate tube, the main gas flow including glass-forming gases; wherein $N \geq 2$.

7. A method according to claim 6, comprising reciprocating a plasma over the length of the substrate tube between a point of reversal near the substrate tube's inlet side and a point of reversal near the substrate tube's outlet side to deposit glass layers onto the substrate tube's interior surface.

* * * * *